(12) United States Patent
Imoto

(10) Patent No.: US 11,257,768 B2
(45) Date of Patent: Feb. 22, 2022

(54) SEMICONDUCTOR DEVICE AND POWER CONVERSION DEVICE

(71) Applicant: Mitsubishi Electric Corporation, Tokyo (JP)

(72) Inventor: Yuji Imoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 16 days.

(21) Appl. No.: 16/754,712

(22) PCT Filed: Dec. 13, 2017

(86) PCT No.: PCT/JP2017/044652
§ 371 (c)(1),
(2) Date: Apr. 8, 2020

(87) PCT Pub. No.: WO2019/116457
PCT Pub. Date: Jun. 20, 2019

(65) Prior Publication Data
US 2020/0251425 A1 Aug. 6, 2020

(51) Int. Cl.
*H01L 23/31* (2006.01)
*H01L 23/00* (2006.01)
(Continued)

(52) U.S. Cl.
CPC ........ *H01L 23/562* (2013.01); *H01L 23/3121* (2013.01); *H01L 23/3735* (2013.01); *H01L 23/50* (2013.01); *H01L 24/73* (2013.01); *H02M 7/53871* (2013.01); *H01L 2224/73265* (2013.01); *H01L 2924/1033* (2013.01); *H01L 2924/10253* (2013.01); *H01L 2924/10272* (2013.01); *H01L 2924/12032* (2013.01); *H01L 2924/12036* (2013.01); *H01L 2924/13055* (2013.01);
(Continued)

(58) Field of Classification Search
CPC ............... H01L 23/562; H01L 23/3121; H01L 23/3575; H01L 24/73
See application file for complete search history.

(56) References Cited

U.S. PATENT DOCUMENTS 10,083,917 B1 * 9/2018 Joshi ...................... H01L 23/367
2005/0085006 A1 * 4/2005 Voelz ...................... H01L 24/82
438/106

(Continued)

FOREIGN PATENT DOCUMENTS

JP H02-240955 A 9/1990

OTHER PUBLICATIONS

International Search Report issued in PCT/JP2017/044652; dated Feb. 27, 2018.

*Primary Examiner* — Nathan W Ha
(74) *Attorney, Agent, or Firm* — Studebaker & Brackett PC

(57) ABSTRACT

The object is to provide a technique that can prevent cracks from appearing in an undesirable portion in a resin. A semiconductor device includes an electronic circuit including a semiconductor element, a metal electrode directly connected to the electronic circuit, and an encapsulation resin. The encapsulation resin encapsulates the electronic circuit and the metal electrode. An end portion of the metal electrode on a surface opposite to a surface facing the electronic circuit is acute-shaped, and an end portion of the metal electrode on the surface facing the electronic circuit is arc-shaped or obtuse-shaped.

11 Claims, 4 Drawing Sheets

(51) Int. Cl.
  *H01L 23/373*  (2006.01)
  *H01L 23/50*   (2006.01)
  *H02M 7/5387*  (2007.01)
  *H02P 27/08*   (2006.01)

(52) U.S. Cl.
  CPC ........... *H01L 2924/13091* (2013.01); *H01L 2924/14252* (2013.01); *H01L 2924/3512* (2013.01); *H02P 27/08* (2013.01)

(56) References Cited

U.S. PATENT DOCUMENTS

| | | | | |
|---|---|---|---|---|
| 2005/0266607 | A1* | 12/2005 | Lee | H01L 23/055 438/106 |
| 2008/0017882 | A1* | 1/2008 | Nakanishi | H01L 23/562 257/177 |
| 2008/0246130 | A1* | 10/2008 | Carney | H01L 23/49568 257/675 |
| 2013/0049137 | A1* | 2/2013 | Uno | H01L 23/49562 257/401 |
| 2013/0099385 | A1* | 4/2013 | Chen | H01L 21/565 257/773 |
| 2014/0048918 | A1* | 2/2014 | Nagaune | H01L 23/4334 257/675 |
| 2014/0061887 | A1* | 3/2014 | Okuda | H01L 23/3142 257/686 |
| 2014/0175644 | A1* | 6/2014 | Srinivasan | H01L 23/562 257/738 |
| 2014/0232455 | A1* | 8/2014 | Teh | H02M 3/1588 327/541 |
| 2015/0206830 | A1* | 7/2015 | Takada | H01L 24/92 257/676 |
| 2015/0262972 | A1* | 9/2015 | Katkar | H01L 25/50 257/48 |
| 2015/0330820 | A1* | 11/2015 | Sakuma | H01L 23/16 257/417 |
| 2016/0079206 | A1* | 3/2016 | Cho | H01L 24/92 257/737 |
| 2016/0197046 | A1* | 7/2016 | Nakata | H01L 21/30604 438/690 |
| 2016/0197066 | A1* | 7/2016 | Uchida | H01L 23/5227 438/3 |
| 2016/0218068 | A1* | 7/2016 | Orimoto | H01L 23/49513 |
| 2016/0233141 | A1* | 8/2016 | Hirobe | H01L 23/10 |
| 2016/0315054 | A1* | 10/2016 | Kajihara | H01L 23/4952 |
| 2017/0103960 | A1* | 4/2017 | Murata | H01L 24/29 |
| 2017/0117201 | A1* | 4/2017 | Yamada | H01L 23/5386 |
| 2018/0248483 | A1* | 8/2018 | Maruyama | H02M 1/08 |
| 2018/0277462 | A1* | 9/2018 | Takahagi | H01L 21/4825 |
| 2019/0067214 | A1* | 2/2019 | Sato | H01L 23/24 |
| 2019/0267331 | A1* | 8/2019 | Hatanaka | H01L 25/072 |

* cited by examiner

F I G. 7
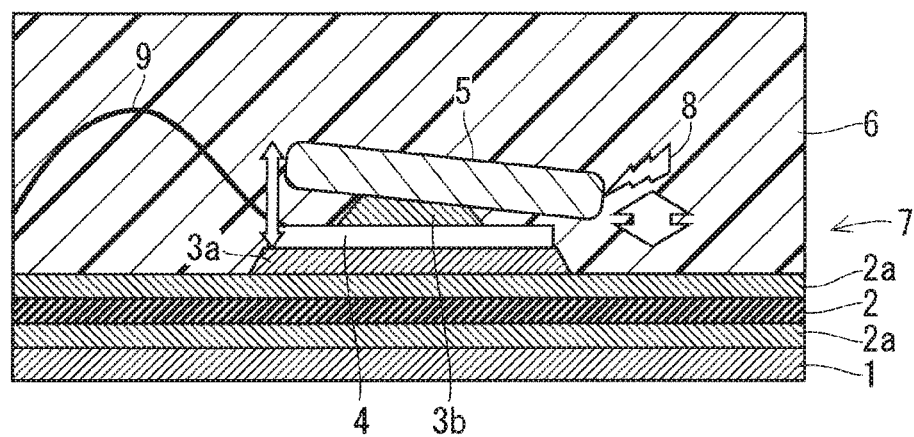
F I G. 8
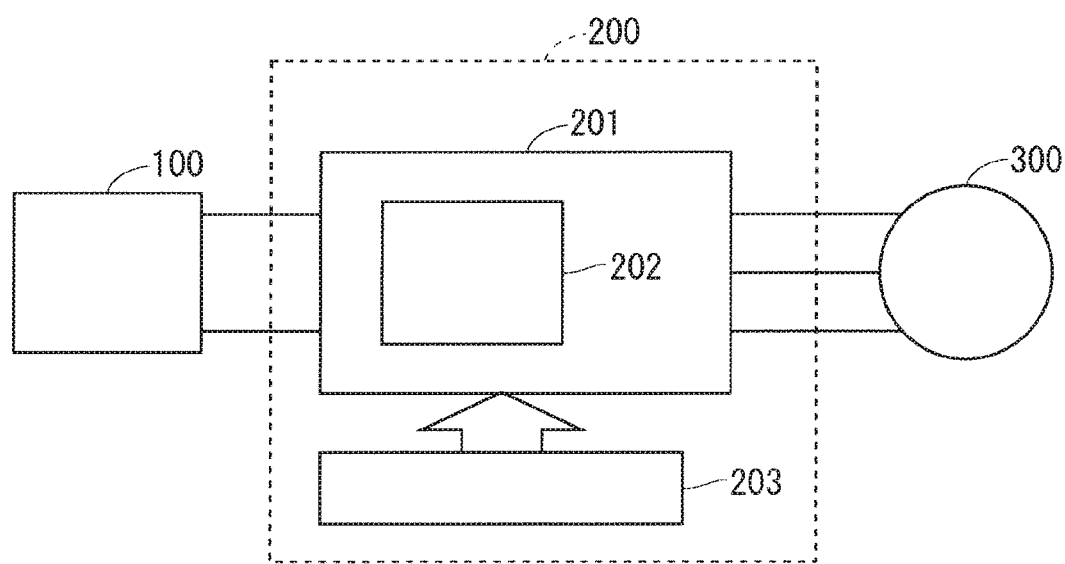

SEMICONDUCTOR DEVICE AND POWER CONVERSION DEVICE

TECHNICAL FIELD

The present invention relates to a semiconductor device in which a resin encapsulates a metal electrode, and a power conversion device including the same.

BACKGROUND ART

The case-type or transfer-molding power modules in which resins encapsulate metal electrodes tend to have a structure of directly connecting a semiconductor element or a circuit surface to a metal electrode to support the high reliability and a large current. Although the reliability of connecting the semiconductor element to the metal electrode is high in this structure, differences in thermal expansion coefficient between the semiconductor element, the circuit surface on which the semiconductor element is mounted, and the metal electrode cause thermal stresses that reduce the reliability under a thermal environment.

Various technologies for reducing the effect of thermal stresses have been proposed. For example, an edge portion of a metal electrode is chamfered or rounded according to the technology of Patent Document 1. Such a structure can relax the thermal stress that easily concentrates on a side portion of the metal electrode, and reduce cracks in a resin.

PRIOR ART DOCUMENT

Patent Document

[Patent Document 1] Japanese Unexamined Patent Application Publication No. H2-240955

SUMMARY

Problem to be Solved by the Invention

Pursuing a larger current and a lower inductance in such a structure requires changes such as thickening metal electrodes and bringing the metal electrodes closer to semiconductor elements. However, differences in thermal expansion coefficient between semiconductor elements or insulating substrates made of, for example, ceramic (for example, 4 ppm/K) and metal electrodes (for example, 17 ppm/K in copper) are relatively large. Making such changes relatively increases the stresses to which resins are subjected from the metal electrodes. Thus, even when the edge portion is chamfered or rounded according to the technology of Patent Document 1, cracks in the resin cannot be prevented. Moreover, there has been a problem of cracks appearing in an undesirable portion.

Although approximating a thermal expansion coefficient of an encapsulation resin to a thermal expansion coefficient of a metal electrode can reduce cracks in the resin around the metal electrode, a difference in thermal expansion coefficient between the encapsulation resin and an insulating substrate increases. Thus, the encapsulation resin comes off from the insulating substrate, which causes a problem of reduction in the reliability of a semiconductor device. Moreover, although adding a silicone plasticizer to the encapsulation resin can increase the resistance of the encapsulation resin to the stresses, a problem of increase in the cost of the encapsulation resin occurs.

Thus, the present invention has been conceived in view of the problems, and the object is to provide a technique that can prevent cracks from appearing in an undesirable portion in a resin.

Means to Solve the Problem

A semiconductor device according to the present invention includes: an electronic circuit including a semiconductor element; a metal electrode directly connected to the electronic circuit; and a resin that encapsulates the electronic circuit and the metal electrode, wherein an end portion of the metal electrode on a surface opposite to a surface facing the electronic circuit is acute-shaped, and an end portion of the metal electrode on the surface facing the electronic circuit is arc-shaped or obtuse-shaped.

Effects of the Invention

According to the present invention, an end portion of the metal electrode on a surface opposite to a surface facing the electronic circuit is acute-shaped, and an end portion of the metal electrode on the surface facing the electronic circuit is arc-shaped or obtuse-shaped. This structure can prevent cracks from appearing in an undesirable portion in a resin.

The object, features, aspects, and advantages of the present invention will become more apparent from the following detailed description and the accompanying drawings.

BRIEF DESCRIPTION OF DRAWINGS

FIG. 7 is a cross section schematically illustrating a structure of a semiconductor device according to Embodiment 5.

FIG. 8 is a block diagram illustrating a configuration of a power conversion system to which a power conversion device according to Embodiment 6 is applied.

DESCRIPTION OF EMBODIMENTS

[Relevant Semiconductor Device]

Before semiconductor devices according to Embodiments of the present invention are described, a semiconductor device relevant to these semiconductor devices (hereinafter referred to as a "relevant semiconductor device") will be described.

Figure 1:
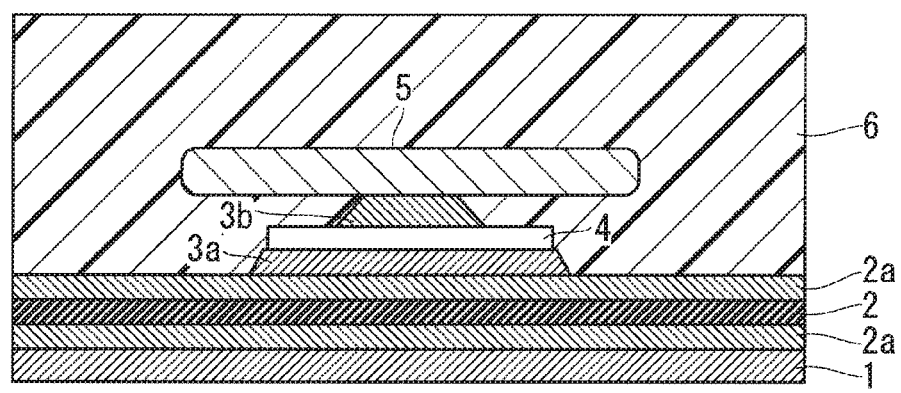
FIG. 1 is a cross section schematically illustrating a structure of a relevant semiconductor device.

FIG. 1 is a cross section schematically illustrating a structure of the relevant semiconductor device. As illustrated in FIG. 1, an insulating substrate 2 is disposed on a base plate 1. The insulating substrate 2 includes metal components 2a such as a circuit pattern. A semiconductor element 4 is bonded to the metal component 2a of the insulating substrate 2 through a bonding material such as a solder 3a. A metal electrode 5 is bonded to the semiconductor element 4 through a bonding material such as a solder 3b. An encapsulation resin 6 encapsulates the semiconductor element 4 and the metal electrode 5.

Here, both of end portions 5a on the top surface of the metal electrode 5 and end portions 5b on the undersurface of the metal electrode 5 are rounded. This structure can relax the stress concentration given from the side surfaces of the metal electrode 5 to the encapsulation resin 6.

However, in a semiconductor device for which a larger current and a lower inductance have been pursued, even the structure of FIG. 1 may not be able to prevent cracks from appearing in the encapsulation resin 6. Moreover, an undesirable portion, for example, a portion surrounding the semiconductor element 4 may have the cracks, which causes a problem of reduction the reliability of the semiconductor device. In contrast, the semiconductor devices according to Embodiments can solve such a problem.

Embodiment 1

Figure 2:
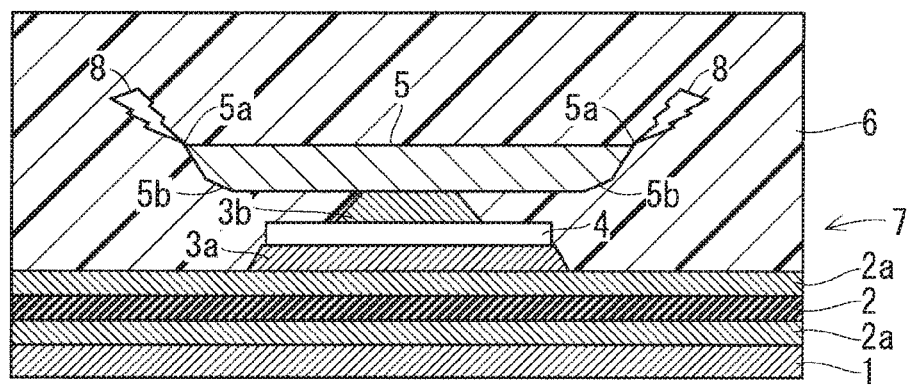
FIG. 2 is a cross section schematically illustrating a structure of a semiconductor device according to Embodiment 1.

FIG. 2 is a cross section schematically illustrating a structure of a semiconductor device according to Embodiment 1 of the present invention. The constituent elements of the semiconductor device according to Embodiment 1 will be described with the same reference numerals of the relevant semiconductor device if they are identical or similar to the constituent elements of the relevant semiconductor device.

The semiconductor device of FIG. 2 includes the base plate 1, the insulating substrate 2, the solders 3a and 3b, the semiconductor element 4, the metal electrode 5, and the encapsulation resin 6 that is a resin. For example, this semiconductor device is used for an inverter that controls a motor of a consumer appliance, an electrical car, or an electric train, or for a regenerative converter.

The insulating substrate 2 is disposed on the base plate 1. The base plate 1 contains, for example, copper (Cu). The insulating substrate 2 contains, for example, ceramic. The insulating substrate 2 may be mounted on the base plate 1 without being integrated with the base plate 1, or may be integrated with the base plate 1. Furthermore, the rear surface of the base plate 1 need not be a flat surface, but may be a surface into which a cooler such as pin fins is integrated.

The insulating substrate 2 includes the metal components 2a such as a circuit pattern. The semiconductor element 4 is bonded to the metal component 2a of the insulating substrate 2 through a bonding material such as the solder 3a.

An electronic circuit 7 is a circuit including the base plate 1, the insulating substrate 2, the solders 3a and 3b, and the semiconductor element 4, and is directly connected to the metal electrode 5.

The metal electrode 5 is disposed above the semiconductor element 4, and is electrically connected to the semiconductor element 4 through the solder 3b. The metal electrode 5 is, for example, an electrode terminal, and contains at least one of copper, aluminum, and the other metal materials. The circuit pattern and the semiconductor element 4, and the semiconductor element 4 and the metal electrode 5 are bonded with, but not limited to, a solder. These may be bonded with, for example, silver (Ag).

The top surface of the metal electrode 5 is a surface opposite to the surface facing the electronic circuit 7, and the undersurface of the metal electrode 5 is the surface facing the electronic circuit 7 according to Embodiment 1. Furthermore, the end portions 5a on the top surface of the metal electrode 5 are acute-shaped, and the end portions 5b on the undersurface of the metal electrode 5 are chamfered that is obtuse-shaped. The end portions 5h of the metal electrode 5 may be rounded that is arc-shaped, instead of being chamfered.

The encapsulation resin 6 encapsulates the electronic circuit 7 and the metal electrode 5. Accordingly, the encapsulation resin 6 fills the surrounding areas of the semiconductor element 4 and the metal electrode 5.

Conclusion of Embodiment 1

Once the metal electrode 5 is heated or generates heat by temperature cycling or power cycling, the metal electrode 5 is expanded but the encapsulation resin 6 in contact with the semiconductor element 4 and the insulating substrate 2 whose thermal expansion coefficients are lower are restrained by the semiconductor element 4 and the insulating substrate 2. Thus, the encapsulation resin 6 is subjected to the stress from the metal electrode 5. Here, the encapsulation resin 6 is less subjected to the intensive stress from the end portions 5b that are obtuse-shaped, and is more subjected to the intensive stress from the end portions 5a that are acute-shaped.

Thus, even when cracks appear in the encapsulation resin 6, cracks 8 which are relatively distant from the electronic circuit 7 and start from the end portions 5a are preferentially produced. After the cracks 8 which start from the end portions 5a appear, the stress to which the encapsulation resin 6 is subjected from the metal electrode 5 decreases. Thus, cracks can be prevented from appearing in the vicinity of the electronic circuit 7.

Consequently, a crack portion can be controlled in the semiconductor device according to Embodiment 1, and cracks can be prevented from appearing in an undesirable portion and in an undesirable direction such as the surrounding area of the semiconductor element 4.

As a result, cracking in the semiconductor element 4 can be prevented, and the reliability and lifespan of a semiconductor device under a thermal environment can be increased. Furthermore, there is no need to, for example, specifically tune the properties for the encapsulation resin 6 and add coding to the end surface of the metal electrode 5 to relax the stress, which can reduce increase in the cost. Moreover, press working, which can easily change the shape of an object to be processed by changing the design of a progressive die stage, can form the metal electrode 5. Thus, the additional cost of a product can be decreased. In addition, the aforementioned measures should be taken only on a minimal portion necessary for the reliability. Thus, there is no need to strictly manage resin properties that may affect the reliability or a design parameter in an assembly process. As a result, reduction in the management cost and a rejection rate can be expected.

The semiconductor element 4 may contain silicon (Si) or a wide bandgap semiconductor such as silicon carbide (SiC) or gallium nitride (GaN). In particular, the wide bandgap semiconductor has high-temperature resistance. Thus, increase in the reliability under a thermal environment is particularly effective in a structure where the semiconductor element 4 of the semiconductor device includes the wide bandgap semiconductor. Moreover, the semiconductor element 4 may be, for example, a MOSFET, an IGBT, an SBD, or a PN diode.

Embodiment 2

Figure 3:
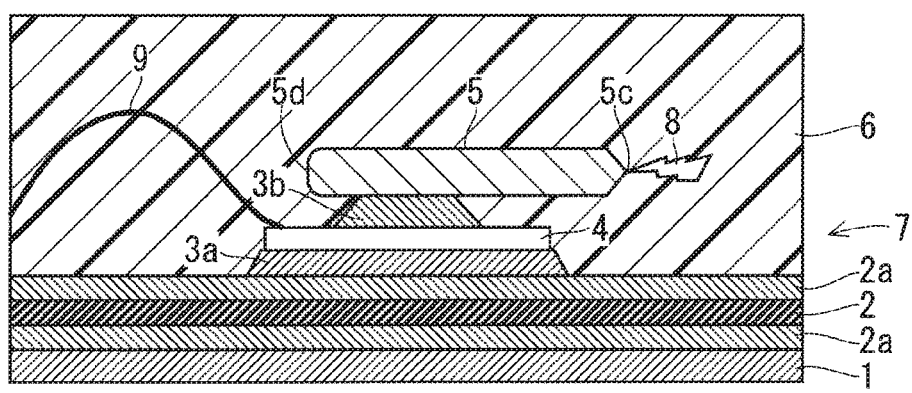
FIG. 3 is a cross section schematically illustrating a structure of a semiconductor device according to Embodiment 2.

FIG. 3 is a cross section schematically illustrating a structure of a semiconductor device according to Embodiment 2 of the present invention. The same reference numerals will be assigned to the constituent elements according to Embodiment 2 if the constituent elements are identical or similar to the aforementioned constituent elements, and the different constituent elements will be mainly described.

The semiconductor device of FIG. 3 includes the base plate 1, the insulating substrate 2, the solders 3a and 3b, the semiconductor element 4, the metal electrode 5, the encapsulation resin 6 that is a resin, and a wire 9 that is a circuit element.

The wire 9 is, for example, an aluminum wire, and is connected to the semiconductor element 4. The metal electrode 5 is disposed lateral to the wire 9 and above the semiconductor element 4, and is electrically connected to the wire 9 through the semiconductor element 4 and the solder 3b.

The electronic circuit 7 is a circuit including the base plate 1, the insulating substrate 2, the solders 3a and 3h, semiconductor element 4, and the wire 9, and is directly connected to the metal electrode 5. The encapsulation resin 6 encapsulates the electronic circuit 7 and the metal electrode 5.

According to Embodiment 2, a side portion 5c of the metal electrode 5 that is a portion opposite to the side facing the wire 9 is acute-shaped, and a side portion 5d of the metal electrode 5 that is a portion facing the wire 9 is rounded that is arc-shaped. The side portion 5d may be chamfered, or approximately rounded through sculpturing in a bending process during pressing similarly to Embodiment 3 to be described later. Although the center portion of the side portion 5c in a thickness direction is acute-shaped in FIG. 3, the end portions on the top surface of the metal electrode 5 may be acute-shaped similarly to Embodiment 1 (FIG. 2).

Conclusion of Embodiment 2

In the semiconductor device according to Embodiment 2, the cracks 8 which are relatively distant from the wire 9 and start from the side portion 5c can be preferentially produced similarly to Embodiment 1. Thus, cracks can be prevented from appearing in an undesirable portion such as the surrounding area of the wire 9. As a result, a break in the wire 9 can be prevented, and the reliability and lifespan of the semiconductor device can be increased.

Embodiment 3

Figure 4:
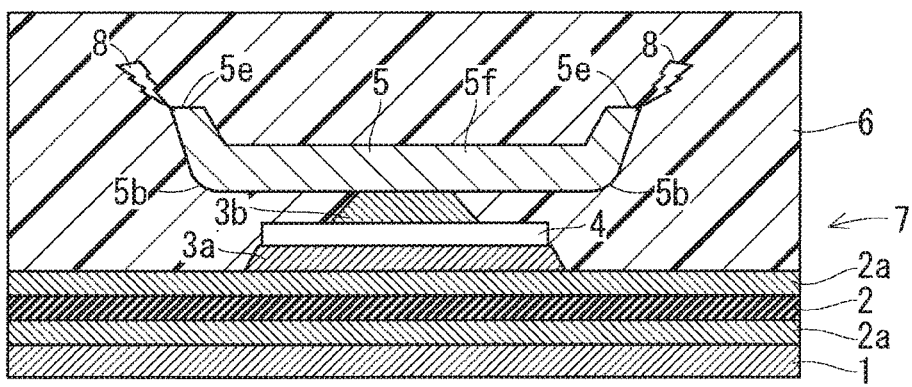
FIG. 4 is a cross section schematically illustrating a structure of a semiconductor device according to Embodiment 3.

FIG. 4 is a cross section schematically illustrating a structure of a semiconductor device according to Embodiment 3 of the present invention. The same reference numerals will be assigned to the constituent elements according to Embodiment 3 if the constituent elements are identical or similar to the aforementioned constituent elements, and the different constituent elements will be mainly described.

In the semiconductor device of FIG. 4, portions of the metal electrode 5 that are adjacent to edges 5e (portions in close proximity to the edges 5e) have an upward-folded shape. In other words, the portions of the metal electrode 5 in close proximity to the edges 5e have an uplift shape. Consequently, the end portions 5b on the lower side are approximately rounded through sculpturing in a bending process during pressing. These shapes can be formed by, for example, folding a flat metal electrode by being pressed. The shapes can be formed by, not limited to this, but thinning a center portion 5f of the metal elect rode through machining such as cutting.

Conclusion of Embodiment 3

In the semiconductor device according to Embodiment 3, the end portions 5a on the top surface where the cracks 8 easily appear can be located more distant from the semiconductor element 4 than those according to Embodiment 1. Thus, the crack portion can be more effectively controlled, and the reliability and lifespan of the semiconductor device can be more increased. Furthermore, the stresses produced when products are assembled through, for example, a soldering process may generally create the bending stress that interferes with the extension of the metal electrode 5 in a depth direction of FIG. 4. In contrast, since the shape of FIG. 4 according to Embodiment 3 can increase the strength against the bending stress, deformation of the metal electrode 5 can be prevented, and the product quality can be enhanced.

Embodiment 4

Figure 5:
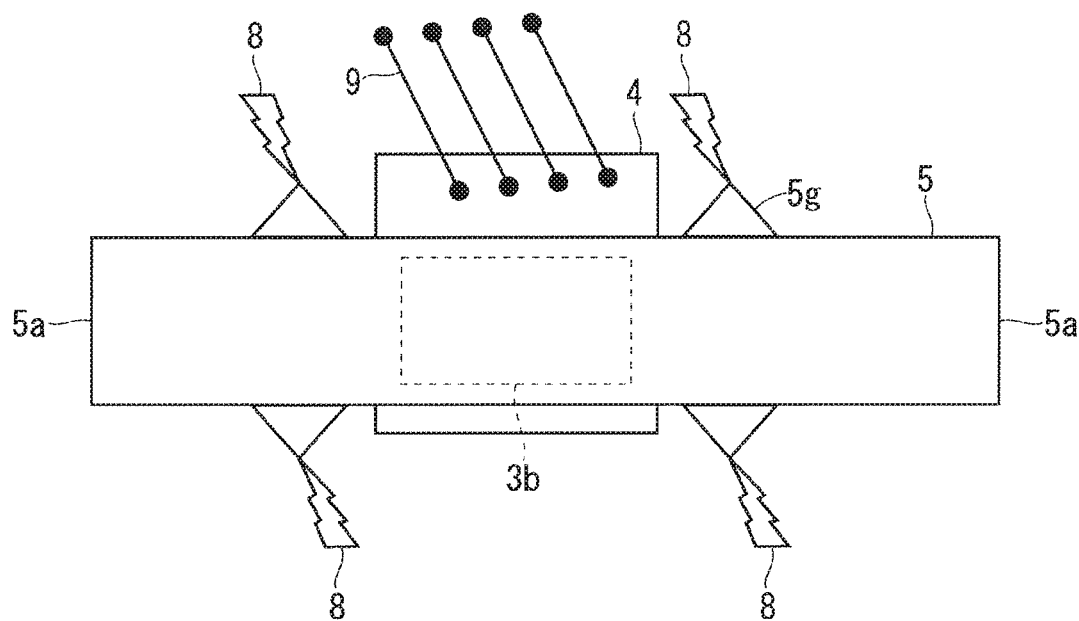
FIG. 5 is a plan view schematically illustrating a structure of a semiconductor device according to Embodiment 4.

FIG. 5 is a plan view schematically illustrating a structure of the metal electrode 5 of a semiconductor device according to Embodiment 4 of the present invention. The same reference numerals will be assigned to the constituent elements according to Embodiment 4 if the constituent elements are identical or similar to the aforementioned constituent elements, and the different constituent elements will be mainly described.

As illustrated in FIG. 5 according to Embodiment 4, the metal electrode 5 includes protrusions 5g, and the electronic circuit 7 including the semiconductor element 4 and wires 9 is disposed in a direction other than the orienting direction of tips of the protrusions 5g. Although the protrusions 5g are approximately triangular in FIG. 5, they, may be, for example, arrow-shaped. Although the tips of the protrusions 5g are oriented toward the plane direction of the metal electrode 5 and the protrusions 5g are disposed at respective positions to sandwich the semiconductor element 4 and the wires 9 in the plan view in FIG. 5, the protrusions 5g are not limited to these. The protrusions 5g should be disposed, for example, in a portion where the cracks 8 are preferentially and desirably produced.

Conclusion of Embodiment 4

According to Embodiment 4, the crack portion can be more effectively controlled. Moreover, the cracks can be dispersedly produced, and each of the cracks can be downsized.

Embodiment 5

Figure 6:
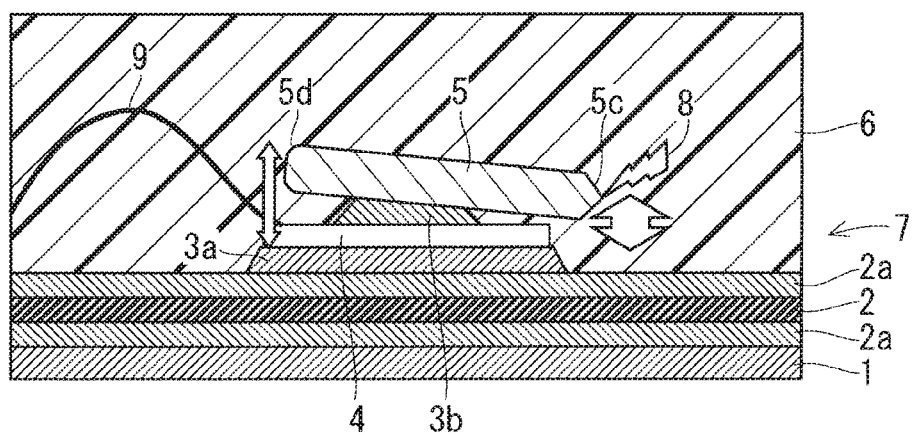
FIG. 6 is a cross section schematically illustrating a structure of a semiconductor device according to Embodiment 5.

FIG. 6 is a cross section schematically illustrating a structure of the metal electrode 5 of a semiconductor device according to Embodiment 5 of the present invention. The same reference numerals will be assigned to the constituent elements according to Embodiment 5 if the constituent elements are identical or similar to the aforementioned constituent elements, and the different constituent elements will be mainly described.

As illustrated in FIG. 6 according to Embodiment 5, the metal electrode 5 is tilted toward the semiconductor element 4 so that the side portion 5c of the metal electrode 5 that is a portion opposite to the side facing the wire 9 is closer to the semiconductor element 4 than the side portion 5d of the metal electrode 5 that is a portion facing the wire 9 is.

Conclusion of Embodiment 5

The difference in thermal expansion coefficient between the metal electrode 5 and the semiconductor element 4 has a relatively large influence on the side portion 5c of the metal electrode 5 that is closer to the semiconductor element 4, and has a relatively small influence on the side portion 5d of the metal electrode 5 that is more distant from the semiconductor element 4. Since the stress to which the encapsulation resin 6 is subjected from the side portion 5c of the metal electrode 5 is larger than the stress to which the encapsulation resin 6 is subjected from the side portion 5d of the metal electrode 5, the cracks 8 that are relatively distant from the wire 9 and start from the side portion 5c can be preferentially produced. Thus, the crack portion can be more effectively controlled.

Although the structure in which Embodiment 5 is applied to Embodiment 2 is described above, Embodiment 5 may be applied to the other Embodiments 1, 3, and 4 and to the relevant semiconductor device as illustrated in FIG. 7.

Embodiment 6

A power conversion device according to Embodiment 6 of the present invention is a power conversion device including a main conversion circuit including the semiconductor device according to one of Embodiments 1 to 5. Although the aforementioned semiconductor devices are not limited to specific power conversion devices, Embodiment 6 will describe application of the semiconductor device according to one of Embodiments 1 to 5 to a three-phase inverter.

FIG. 8 is a block diagram illustrating a configuration of a power conversion system to which the power conversion device according to Embodiment 6 is applied.

The power conversion system illustrated in FIG. 8 includes a power supply 100, a power conversion device 200, and a load 300. The power supply 100, which is a DC power supply, supplies a DC power to the power conversion device 200. The power supply 100 may be one of various power supplies including a DC system, a solar battery, a rechargeable battery, a rectifying circuit connected to an AC system, and an AC/DC converter. The power supply 100 may also be a DC/DC converter which converts a DC power output from a DC system into a predetermined power.

The power conversion device 200, which is a three-phase inverter connected between the power supply 100 and the load 300, converts the DC power supplied from the power supply 100 into the AC power to supply the AC power to the load 300. As illustrated in FIG. 8, the power conversion device 200 includes a main conversion circuit 201 which converts the DC power into the AC power, and a control circuit 203 which outputs, to the main conversion circuit 201, a control signal for controlling the main conversion circuit 201.

The load 300 is a three-phase electrical motor driven by the AC power supplied from the power conversion device 200. The load 300 is not limited to specific use but is the electrical motor mounted on various types of electrical devices. Thus, the load 300 is used as an electrical motor for, for example, a hybrid car, an electrical car, a rail vehicle, an elevator, or air-conditioning equipment.

The power conversion device 200 will be described in detail hereinafter. The main conversion circuit 201 includes switching elements and free-wheeling diodes (not shown). Switching of the switching element causes the DC power supplied from the power supply 100 to be converted into the AC power. The AC power is then supplied to the load 300. The specific circuit configuration of the main conversion circuit 201 is of various types. The main conversion circuit 201 according to Embodiment 6 is a three-phase flat-bridge circuit having two levels, and may include six switching elements and six free-wheeling diodes anti-parallel connected to the respective switching elements. At least one of the switching elements and the free-wheeling diodes of the main conversion circuit 201 includes a semiconductor module 202 to which the semiconductor device according to one of Embodiments 1 to 5 is applied. The six switching elements form three pairs of upper and lower arms in each pair of which the two switching elements are serially connected to each other. The three pairs of upper and lower arms form the respective phases (U-phase, V-phase, and W-phase) of the full-bridge circuit. Output terminals of the respective pairs of upper and lower arms, i.e., three output terminals of the main conversion circuit 201 are connected to the load 300.

The main conversion circuit 201 includes a drive circuit (not shown) for driving each of the switching elements. The drive circuit may be embedded in the semiconductor module 202 or provided separately from the semiconductor module 202. The drive circuit generates drive signals for driving the switching elements of the main conversion circuit 201, and supplies the drive signals to control electrodes of the switching elements of the main conversion circuit 201. Specifically, the drive circuit outputs, to the control electrodes of the switching elements in accordance with the control signal from the control circuit 203 to be described later, the drive signal for switching the switching element to an ON state and the drive signal for switching the switching element to an OFF state. The drive signal is a voltage signal (ON signal) equal to or higher than a threshold voltage of the switching element when the switching element is kept in the ON state. The drive signal is a voltage signal (OFF signal) equal to or lower than the threshold voltage of the switching element when the switching element is kept in the OFF state.

The control circuit 203 controls the switching elements of the main conversion circuit 201 so that a desired power is supplied to the load 300. Specifically, the control circuit 203 calculates a time (ON time) when each of the switching elements of the main conversion circuit 201 needs to enter the ON state, based on the power which needs to be supplied to the load 300. For example, the main conversion circuit 201 can be controlled by performing Pulse Width Modulation (PWM) control for modulating the ON time of the switching elements in accordance with the voltage which needs to be output. Then, the control circuit 203 outputs a control instruction (control signal) to the drive circuit included in the main conversion circuit 201 so that the drive circuit outputs the ON signal to the switching element which needs to enter the ON state and outputs the OFF signal to the switching element which needs to enter the OFF state at each time. The drive circuit outputs the ON signal or the OFF signal as the drive signal to be control electrode of each of the switching elements in accordance with this control signal.

Since the semiconductor device according to one of Embodiments 1 to 5 is applied as at least one of the switching elements and the free-wheeling diodes of the main conversion circuit 201 in the power conversion device according to Embodiment 6, cracks can be prevented from appearing in an undesirable portion in a resin.

Although Embodiment 6 describes the example of applying the semiconductor device according to one of Embodiments 1 to 5 to the three-phase inverter having the two levels, Embodiment 6 is not limited thereto, but can be applied to the various power conversion devices. Although Embodiment 6 describes the semiconductor device according to one of Embodiments 1 to 5 as the power conversion device having the two levels, the power conversion device may have three or multiple levels. Furthermore, the semiconductor device may be applied to a single-phase inverter when the power is supplied to a single-phase load. Moreover, the semiconductor device can be also applied to a DC/DC converter or an AC/DC converter when the power is supplied to, for example, a DC load.

The load of the power conversion device according to Embodiment 6 is not limited to the electrical motor as described above. The power conversion device can also be used as a power-supply device of an electrical discharge machine, a laser beam machine, an induction heat cooking device, or a non-contact power feeding system, and can be further used as a power conditioner of, for example, a solar power system or an electricity storage system.

Embodiments can be freely combined, and appropriately modified or omitted within the scope of the present invention.

Although this invention has been described in detail, the description is in all aspects illustrative and does not restrict the invention. It is therefore understood that numerous modifications and variations can be devised without departing from the scope of the invention.

EXPLANATION OF REFERENCE SIGNS 4 semiconductor element, 5 metal electrode, 5a, 5b end portion, 5c, 5d side portion, 5e edge, 5g protrusion, 6 encapsulation resin, 7 electronic circuit, 9 wire.

The invention claimed is:

1. A semiconductor device, comprising:
an electronic circuit including a semiconductor element;
a metal electrode connected to the electronic circuit, the metal electrode having a substantially elongated planar shape; and
a resin that encapsulates the electronic circuit and the metal electrode,
wherein an end portion of the metal electrode on a surface opposite to a surface facing the electronic circuit is acute-shaped, and an end portion of the metal electrode on the surface facing the electronic circuit is arc-shaped or obtuse-shaped.

2. The semiconductor device according to claim 1, wherein a portion of the metal electrode that is adjacent to an edge of the metal electrode has an upward-folded shape.

3. The semiconductor device according to claim 1, wherein the metal electrode includes a protrusion, and the electronic circuit is disposed in a direction other than an orienting direction of a tip of the protrusion.

4. The semiconductor device according to claim 1, wherein the semiconductor element includes a wide bandgap semiconductor.

5. A power conversion device, comprising:
a main conversion circuit including the semiconductor device according to claim 1, the main conversion circuit converting an input power to output a resulting power; and
a control circuit outputting, to the main conversion circuit, a control signal for controlling the main conversion circuit.

6. The semiconductor device according to claim 1, wherein the metal electrode is directly connected to the electronic circuit through a bonding material different from the metal electrode.

7. A semiconductor device, comprising:
an electronic circuit including a semiconductor element and a circuit element;
a metal electrode connected to the electronic circuit, the metal electrode having a substantially elongated planar shape; and
a resin that encapsulates the electronic circuit and the metal electrode,
wherein a portion of the metal electrode opposite to a portion facing the circuit element is acute-shaped, and the portion of the metal electrode facing the circuit element is arc-shaped or obtuse-shaped.

8. The semiconductor device according to claim 7, wherein the circuit element includes a wire.

9. The semiconductor device according to claim 7, wherein the metal electrode is disposed lateral to the circuit element and above the semiconductor element, and
the metal electrode is tilted toward the semiconductor element so that the portion of the metal electrode opposite to the portion facing the circuit element is closer to the semiconductor element than the portion of the metal electrode facing the circuit element is.

10. The semiconductor device according to claim 7, wherein the metal electrode is directly connected to the electronic circuit through a bonding material different from the metal electrode.

11. A semiconductor device including a semiconductor element, the semiconductor device comprising:
an electronic circuit including the semiconductor element and a circuit element;
a metal electrode connected to the electronic circuit and disposed lateral to the electronic circuit and above the semiconductor element; and
a resin that encapsulates the electronic circuit and the metal electrode,
wherein the metal electrode is tilted toward the semiconductor element so that a portion of the metal electrode opposite to a portion facing the circuit element is closer to the semiconductor element than the portion of the metal electrode facing the circuit element is.

* * * * *